(12) United States Patent
Muralimanohar et al.

(10) Patent No.: US 10,496,855 B2
(45) Date of Patent: Dec. 3, 2019

(54) ANALOG SUB-MATRIX COMPUTING FROM INPUT MATRIXES

(71) Applicant: Hewlett Packard Enterprise Development LP, Houston, TX (US)

(72) Inventors: Naveen Muralimanohar, Santa Clara, CA (US); Ben Feinberg, Palo Alto, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 16/063,892

(22) PCT Filed: Jan. 21, 2016

(86) PCT No.: PCT/US2016/014342
§ 371 (c)(1),
(2) Date: Jun. 19, 2018

(87) PCT Pub. No.: WO2017/127086
PCT Pub. Date: Jul. 27, 2017

(65) Prior Publication Data
US 2018/0373902 A1    Dec. 27, 2018

(51) Int. Cl.
*G06G 7/161* (2006.01)
*G11C 11/15* (2006.01)
*G11C 13/00* (2006.01)
*G06F 17/16* (2006.01)
*G06G 7/14* (2006.01)
(Continued)

(52) U.S. Cl.
CPC ............. *G06G 7/161* (2013.01); *G06F 9/30* (2013.01); *G06F 17/16* (2013.01); *G06G 7/14* (2013.01); *G06G 7/16* (2013.01); *G11C 11/15* (2013.01); *G11C 13/00* (2013.01); *G11C 13/004* (2013.01); *H03M 1/124* (2013.01); *G11C 7/1006* (2013.01);
(Continued)

(58) Field of Classification Search
CPC ....... G06G 7/161; G06J 1/005; H01L 27/2463
USPC .......................................... 708/835
See application file for complete search history.

(56) References Cited

U.S. PATENT DOCUMENTS 5,065,339 A    11/1991  Vassiliadis et al.
8,433,736 B2   4/2013   Huang et al.
(Continued)

FOREIGN PATENT DOCUMENTS

WO    WO-2016064406    4/2016

OTHER PUBLICATIONS

Hu, M. et al.; "Dot-product Engine for Neuromorphic Computing: Programming 1t1m Crossbar to Accelerate Matrix-vector Multiplication"; Mar. 3, 2016; 7 pages.
(Continued)

*Primary Examiner* — Tan V Mai
(74) *Attorney, Agent, or Firm* — Hewlett Packard Enterprise Patent Department (57) ABSTRACT

A circuit includes an engine to compute analog multiplication results between vectors of a sub-matrix. An analog to digital converter (ADC) generates a digital value for the analog multiplication results computed by the engine. A shifter shifts the digital value of analog multiplication results a predetermined number of bits to generate a shifted result. An adder adds the shifted result to the digital value of a second multiplication result to generate a combined multiplication result.

15 Claims, 5 Drawing Sheets

(51) Int. Cl.
*H03M 1/12* (2006.01)
*G06F 9/30* (2018.01)
*G06G 7/16* (2006.01)
*G11C 7/10* (2006.01)

(52) U.S. Cl.
CPC .. *G11C 2013/0045* (2013.01); *G11C 2213/77* (2013.01)

(56) References Cited

U.S. PATENT DOCUMENTS

| | | |
|---|---|---|
| 8,862,653 B2 | 10/2014 | Bakos |
| 9,058,302 B2 | 6/2015 | Magerlein |
| 9,317,482 B2 | 4/2016 | Davis et al. |
| 2006/0268598 A1 | 11/2006 | Snider |
| 2012/0109866 A1 | 5/2012 | Modha |
| 2013/0028004 A1 | 1/2013 | Snider |
| 2014/0108481 A1 | 4/2014 | Davis et al. |
| 2014/0172937 A1 | 6/2014 | Linderman et al. |
| 2014/0268994 A1 | 9/2014 | Rose et al. |
| 2014/0365548 A1 | 12/2014 | Mortensen et al. |
| 2016/0259826 A1 | 9/2016 | Acar et al. |
| 2018/0301189 A1* | 10/2018 | Hu .................... G11C 13/0002 |
| 2019/0189180 A1* | 6/2019 | Ge ........................ G11C 11/24 |

OTHER PUBLICATIONS

International Searching Authority, The International Search Report and the Written Opinion, PCT/US2016/014342, dated Sep. 30, 2016, 10 Pgs.

Marshall, A. et al., "Architecting a Large—Scale Elastic Environment", http://www.nimbusproject.org/files/marshall-icsoft2012.pdf, (Research Paper), May 4, 2012, 10 pages.

\* cited by examiner

ANALOG SUB-MATRIX COMPUTING FROM INPUT MATRIXES

BACKGROUND

A resistive memory array can be utilized to perform analog computations that exploit the fundamental relationship between row voltage and column current in a resistive mesh to realize an analog multiply-accumulate unit. Such a unit is not only faster than a pure digital computation, but also consumes significantly lower energy than traditional digital functional units. The memory array is typically organized as a grid of cells interconnected by horizontal and vertical wires, referred to as word lines and bit lines. While it is known that accessing the memory cells involves activating a row followed by reading or writing to bit lines, the effect of row activation signal on bit line voltage/current can also be interpreted as a bitwise AND operation between row signal and cell value. With emerging resistive memories, the above concept can be further developed to build a powerful multiply-accumulate unit within the memory. For instance, the fundamental relationship between a row access voltage and the resulting bit line current can act as an analog multiplier of row voltage and cell conductance. Instead of accessing a single row as performed for loading and storing data, multiple rows can be activated concurrently.

DETAILED DESCRIPTION

This disclosure relates a scalable and configurable circuit to perform analog computing where input matrixes are processed as sub-matrixes. Memristor arrays are employed as computing engines where cell conductance and voltage values perform an analog multiplication between vectors representing the respective values. The vectors from the input matrixes are generally greater than the size of the memristor arrays and thus are broken into smaller units (e.g., clusters operating on sub matrixes) to accommodate the array size and then combined via a parallel pipelined architecture to facilitate computational speed. The circuit can include multiple engines that form clusters to process results received from the input matrix. In one example of a cluster having two engines, a first engine can be formed from a first memristor array to compute a first analog multiplication result between vectors of a first sub-matrix. The first sub-matrix can be programmed from a portion of the input matrix. Similarly, a second engine in the cluster can be formed from a second memristor array (or different portion of first memristor array) to compute a second analog multiplication result between vectors of a second sub-matrix, where the second sub-matrix is programmed from another portion of the input matrix.

An analog to digital converter (ADC) (or converters) generate a digital value for the first and second analog multiplication results computed by the first and second engines. These results are then combined in a pipeline that includes a shifter to shift the digital value of first analog multiplication result a predetermined number of bits to generate a shifted result. An adder then adds the shifted result to the digital value of the second multiplication result to generate a combined multiplication result from the first sub-matrix and the second sub-matrix. A plurality of such clusters can be configured to process the input matrix. Resources such as ADC's can be shared between clusters to conserve power and integrated circuit resources, for example. Various configuration options can be provided to dynamically configure operations of the clusters, digital converters, shift operations, and other aspects of the pipelined architecture.

Figure 1:
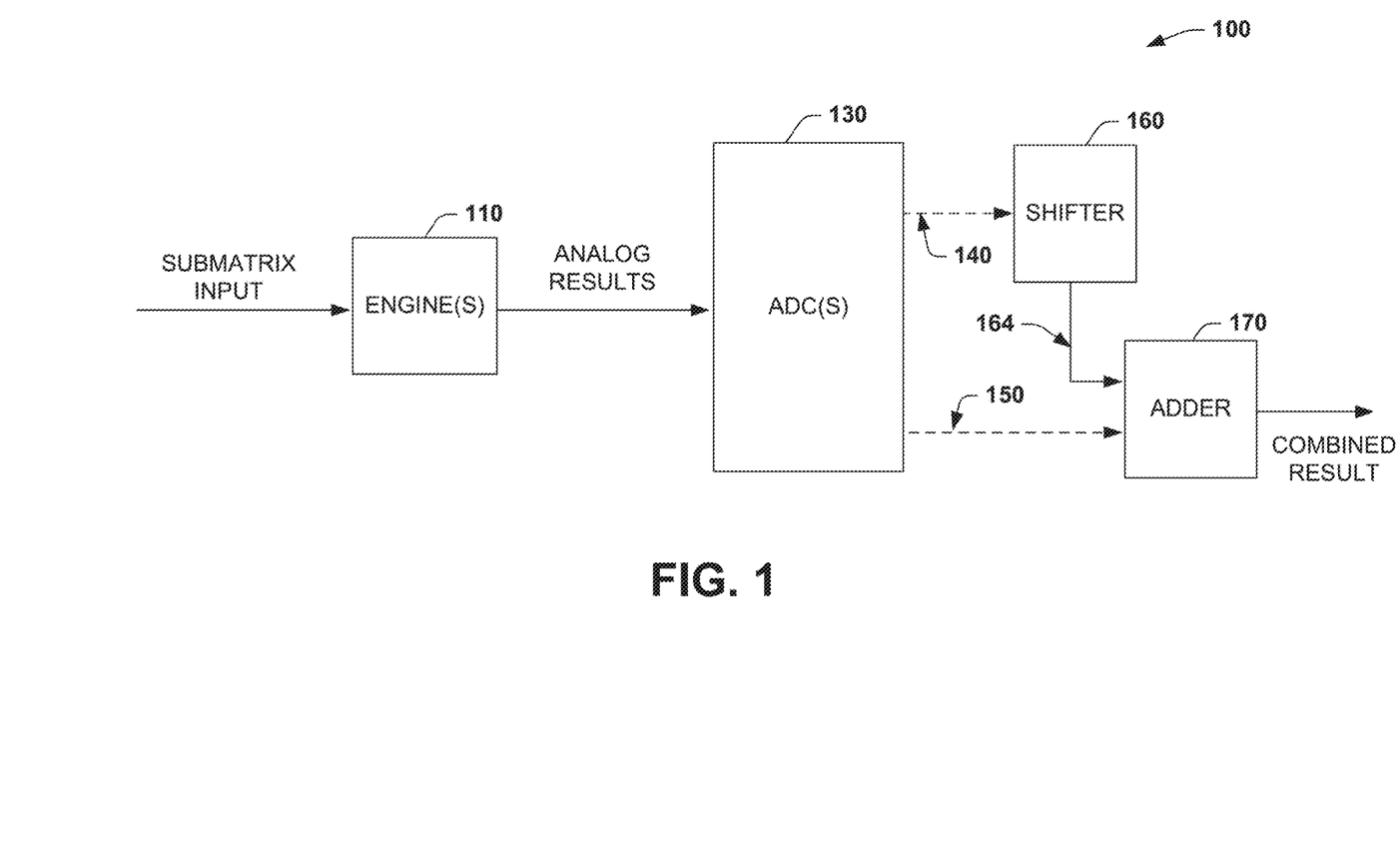
FIG. 1 illustrates an example of a circuit for performing analog sub-matrix computations from input matrix values.

FIG. 1 illustrates an example of a circuit 100 for performing analog sub-matrix computations from input matrix values. The circuit 100 includes an engine 110 (or engines) formed from a memristor array to compute an analog multiplication result shown as ANALOG RESULT 1 between vectors of a sub-matrix shown as SUBMATRIX INPUT. The sub-matrix is programmed from a portion of an input matrix. As used herein, the term input matrix refers to a matrix of values to be multiplied where the respective values are greater than the number of computing elements (e.g., rows/columns) that perform the multiplication. Thus, a sub-matrix represents a computing matrix that computes portions of input vectors from the input matrix as smaller computing values that can be consumed/processed (wholly or in part) within the sub-matrix. An analog to digital converter (ADC) 130 (or converters or converter arrays) generates a digital value for the analog multiplication results shown at 140 and 150 as computed by the first and second engines, respectively. The engine 110 can be combined with other engines to form a cluster of engines. If a single engine is employed, results can be stored in a holding buffer, shifted, and then added to other results that are processed by the single engine. If multiple engines are employed shift and add operations can occur in parallel across an internal h-tree configuration within a cluster and/or across an external h-tree configuration connecting multiple clusters where cluster results are combined by an external controller (See e.g., FIG. 4).

A shifter 160 shifts the digital value of the analog multiplication result 140 a predetermined number of bits to generate a shifted result at 164. An adder 170 adds the shifted result 164 to the digital value of another multiplication result 150 to generate a combined multiplication result from the sub-matrix. A plurality of such engines 110 can be combined to form computing clusters that are illustrated and described below with respect to FIG. 4, where each cluster has its respective shifting and adding operations to pipeline results. Outputs from the respective clusters can be combined to form an overall result for the matrixes to be multiplied.

The engine 110 can be configured to perform a matrix dot product operation between the vectors, in one example. In other examples, the respective engines can perform a matrix cross product operation between the vectors or a multiply operation between two scalar values, for example. A digital to analog converter (DAC) (not shown) can be provided to generate analog representations of the vectors. A vector buffer (See e.g., FIG. 4) can be provided to store the vectors to be digitized by the DAC (or DACS).

As noted above, the engine 1110 can be combined with at least one other engine and configured as a cluster of engines. The output of each engine in the cluster can be combined to form combined multiplication result representing multiplications from the vectors represented in the input matrix. The engines can communicate across an active h-tree within the cluster of engines where the shift width varies at each level of the h-tree. For example, at one level of the h-tree the shift width may be two digits where at other levels od the h-tree, the shift width may be a number other than two. A configuration register (See e.g., FIG. 4) can be provided to dynamically specify a number of DAC bits utilized by the DAC, a number of cell levels in a respective matrix, a number of bits in the ADC output, and a number for shifting the number of bits in the shifter 140 to generate the shifted result, A results buffer (not shown) can also be provided to hold the combined multiplication result from the cluster. At least one other cluster can be provided to process another portion of the matrix. Output from each cluster can be added to form an overall multiplication result for the matrix. When multiple clusters are processed, an analog to digital converter (ADC) array can be provided that is shared between at least two clusters to generate digital values for analog computation results from the respective clusters. A system controller (See e.g., FIG. 4) can be provided to control the ADC array and to aggregate the computation results from the respective clusters.

Figure 2:
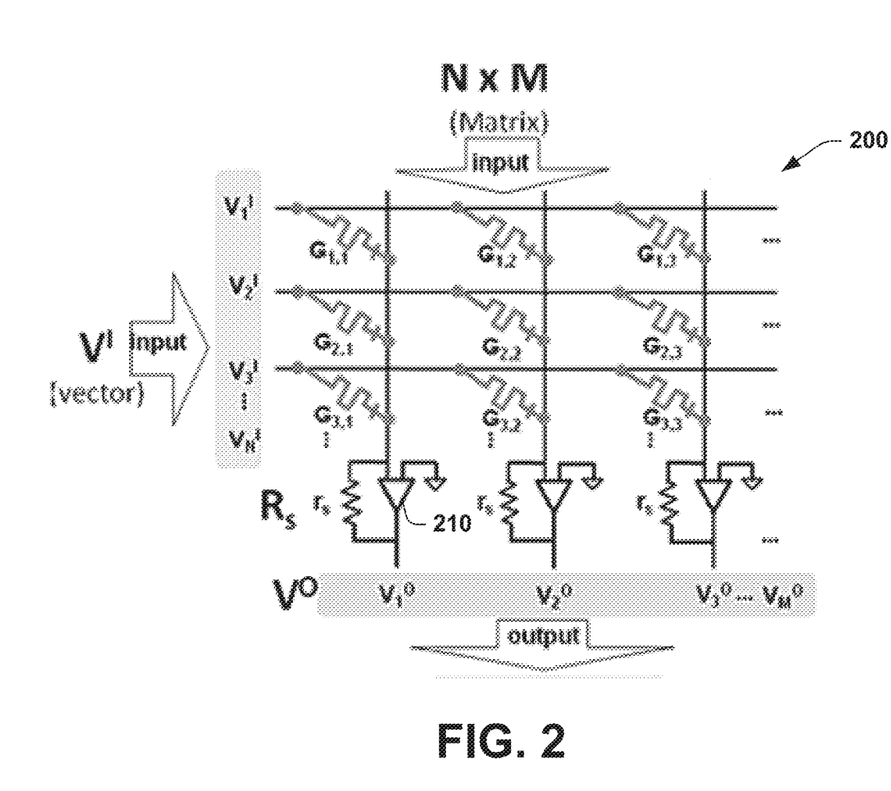
FIG. 2 illustrates an example of an engine for performing sub-matrix computations.

FIG. 2 illustrates an example of an engine 200 for performing sub-matrix computations. The engine 200 includes multiple rows for programming a first part of an N×M matrix as N voltage inputs of the matrix which are multiplied as G column conductance values representing the M vector of the matrix, where N, M, and G are positive integers respectively. The engine 200 can be employed as a basic micro architecture of a dot product engine (DPE) although other types of multiplications are possible. Each row can be equipped with a Digital-to-Analog Converter to provide different read voltages determined based on the input vector to be multiplied. Also, every column has a transimpedance amplifier such as shown at 210, which in turn is connected to an Analog-to-Digital Converter (ADC) to digitize the bit-line current from the respective columns. Generally, an ADC requires more silicon real estate than an array. To reduce the total area, an ADC can be operated at higher frequency and time multiplexed across multiple bit lines. Finally, a set of configuration registers (not shown) specifies number of valid output bits (No) from the ADC, number of simultaneous rows that can be activated (NR), and bit density of cells (Cb). These configuration registers help tailor the engine 200 to different applications dynamically.

The engine 200 has two modes of operation: memory and compute modes. The memory mode is similar to a typical memory—a read operation can leverage ADCs in a DPE to sense a cell content. A write to a cell is accomplished by activating a row followed by the application of write voltage to the selected bit lines. As each cell requires precise tuning, a program and verify circuit can be employed for normal write operations. When in compute mode, based on the configuration register NR, multiple rows are activated, and an ADC is used to convert the resulting bit line current to a fixed point number.

To perform a dot-product operation, for instance, a B, where a is a vector, each element of matrix B is first programmed to its equivalent analog conductance state of the memristors G. The input vector a is converted to analog input vector voltages Vi by the respective DACs. For the purpose of this example, assume each element of B can be represented by a memristor cell and the input vector elements can be converted to a single analog value using DACs. The mapping process begins with scanning of matrix elements for the highest (h) and the lowest (l) values. These values typically correspond to the minimum and maximum resistances of a memristor cell. Every other element is then mapped to a resistance according to its ratio with h and l. The actual mapping process can be more complex than the linear mapping mentioned above. For instance, the effect of parasitic such as IR drop, data pattern, location of a cell and so forth can change how a value is mapped to a cell conductance. Finally, the output current is collected by the transimpedance amplifier at each column with a reference resistance RS. The output current IO=ΣVi.Gi reflects the corresponding dot-product operation. This value is then digitized using an ADC. The parameters of the engine 200 such as number of levels in a cell, analog to digital converter specification (ADC bits), digital to analog converter specification (size of input bits to DAC), and the size of an array are all coupled to each other. To mitigate data loss, the ADC specification should meet the following requirement, where NR is the number of rows activated in DPE mode, DACb is the input bit width of DAC, and Mb is the number of bits stored in a memristor cell. The following Equation 1 specifies ADC and DAC combinations that can be dynamically specified via register settings.

$$ADCbits = \begin{cases} \log2(N_R) + DAC_b + M_b & \text{if } DAC_b > 1 \\ \log2(N_R) + M_b & \text{if } DAC_b = 1 \\ \log2(N_R) + DAC_b & \text{if } M_b = 1 \end{cases}$$

Figure 3:
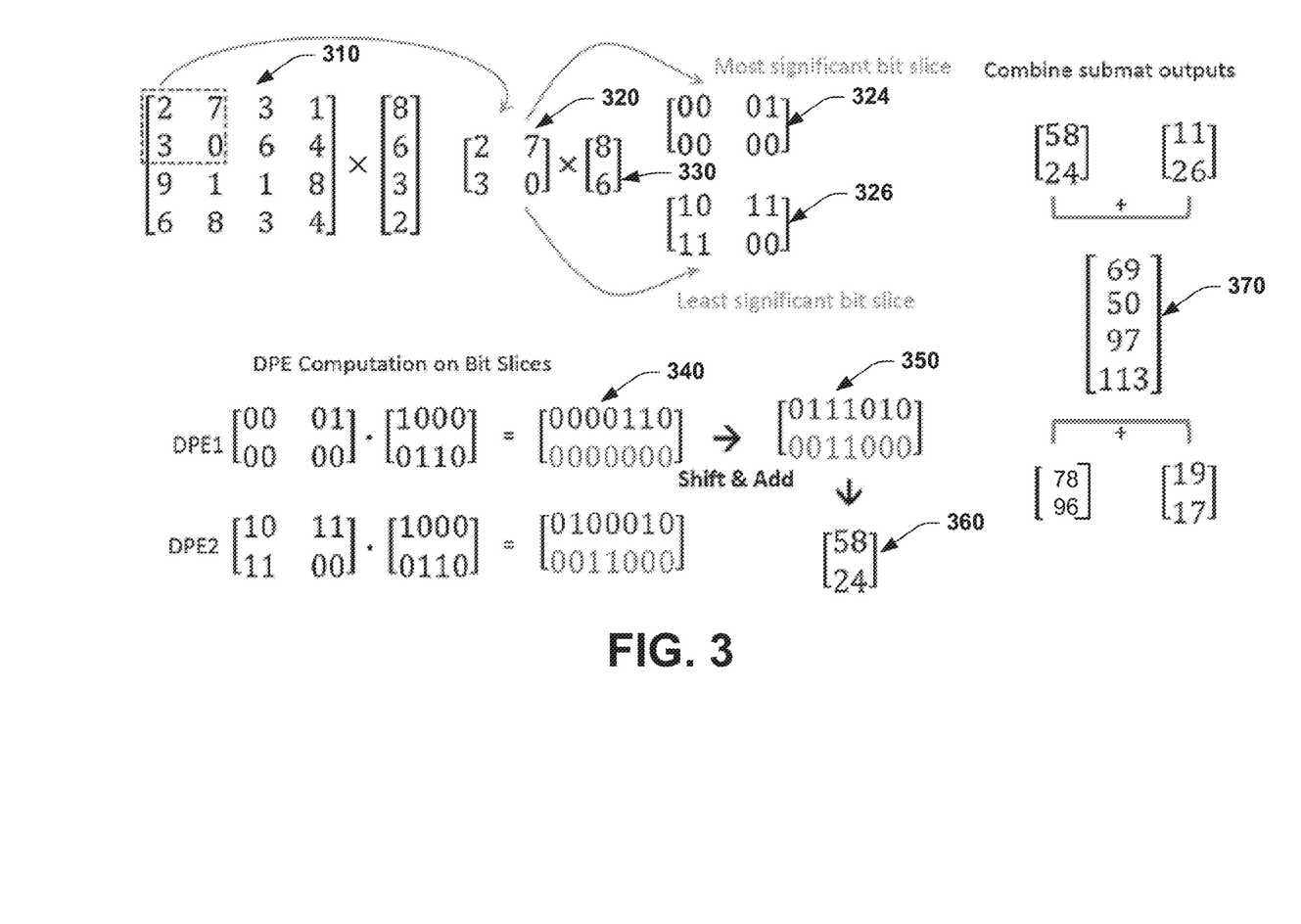
FIG. 3 illustrates an example of a sub-matrix computation derived from portions of an input matrix.

FIG. 3 illustrates an example of a sub-matrix computation derived from portions of an input matrix. A 4×4 input matrix 310 is broken into smaller sub-matrixes. One such sub-matrix portion is shown at 320 which includes members 2, 7, 3, and 0. The sub-matrix portion 320 is further represented as bit slices 324 and 326 which are multiplied by vector portion represented by members 8 and 6 at 330. The matrices for scientific applications are typically much greater than a single engine can compute. For example, each element utilizes up to 252 bits to represent a floating point number as a fixed point number, whereas a memristor cell can store up to 5 bits, for example. In order to perform computation using memristor engines, an input matrix is divided into both fewer rows/columns and smaller bit slices. The input matrix 310 is first divided into a set of submats (also referred to as sub-matrixes), where a submat is a contiguous section of the input matrix with dimensions similar to or smaller than the respective engine. For a hypothetical example, assume an engine of size 2×2 made of 2 bit memristor cells. FIG. 3 shows an example 4×4 matrix being split into four sub-matrices but other matrix sizes and sub-matrix divisions are possible.

As the matrix elements vary from 0-8 for example, four bits are used to represent each element. Since each memristor cell in this example can store 2 bits, a sub-matrix such as shown at 320 is further broken into bit slices as shown at 324 and 326. Assuming a 4 bit DAC, FIG. 3 shows how two engines shown as DPE 1 and DPE 2 can be used in parallel to generate bit slice results. Note that as per Equation 1 above, with a 2 bit cell (Mb=2), 4b DAC, and 2×2 DPE, a 7 bit ADC is employed. Hence, each bit-slice result will be of 7 bits each for this specific example. To determine the sub-matrix result, these 7b outputs shown at 340 are shifted by two bits (with shift width being the same as the bit-slice size) and added together at 350 to produce result matrix having members 58 and 24 at 360. As a general rule, when respective DPEs (or engines) generate bit-slice results, they are combined together by shift and add operations, Similar to the limited storage of memristor cells, on most occasions a digital to analog converter cannot convert an entire element to an analog value. In this case, the vector is also partitioned into bit-slices based on DAC specification (DACb), and their partial results are combined using similar shift and add operations as described herein. At 370, the combined results of the matrix multiplication are shown where each sub-matrix result 58/11, 24/26, 78/19, and 96/17 are added to produce combined results 69, 50, 97, and 113 respectively at 370.

Figure 4:
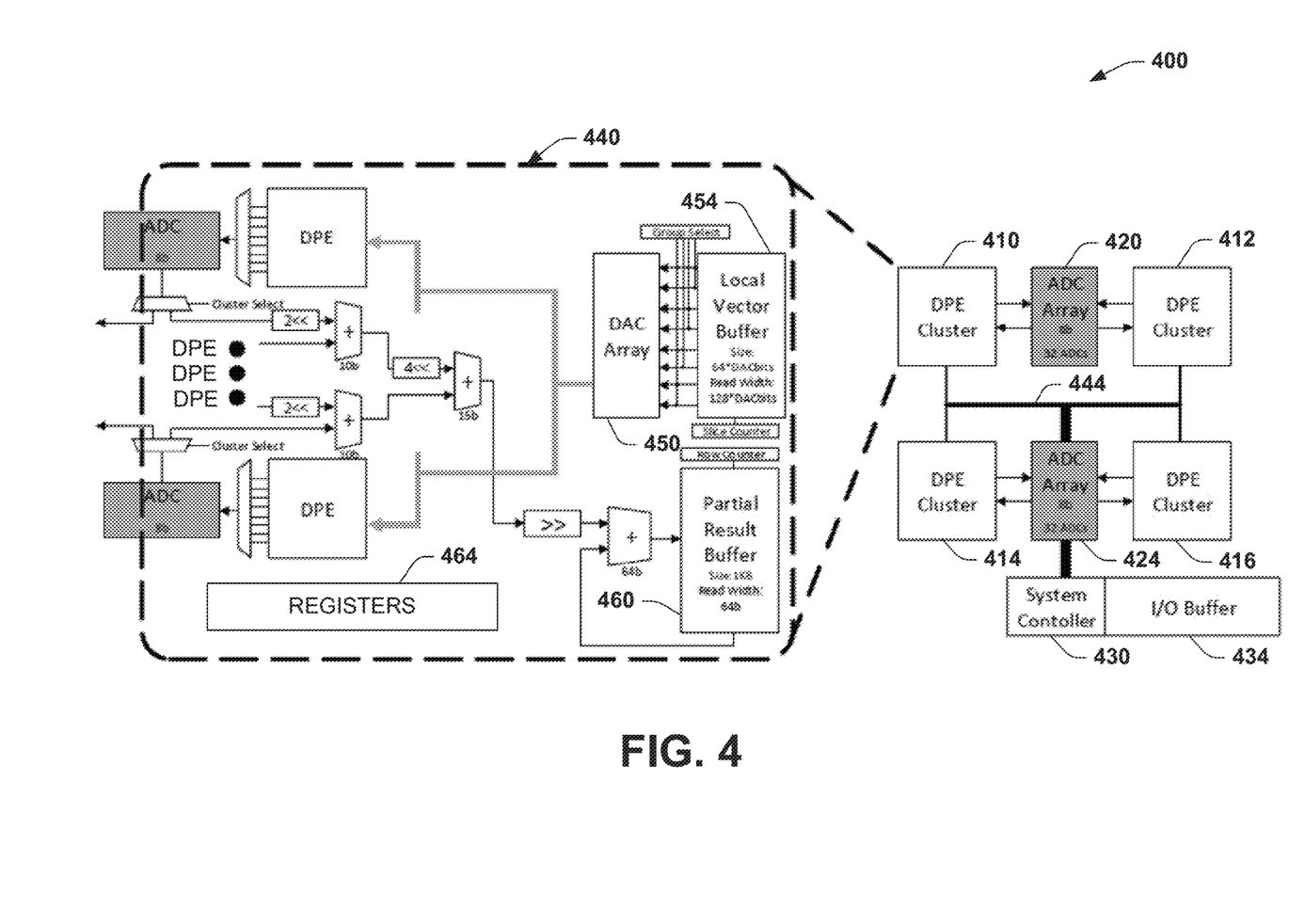
FIG. 4 illustrates an example of a circuit that utilizes cluster processing to performing analog sub-matrix computations from input matrix values.

FIG. 4 illustrates an example of a circuit 400 that utilizes cluster processing to performing analog sub-matrix computations from input matrix values. In this example, multiple DPE clusters are shown at 410, 412, 414, and 416 are employed to perform the sub-matrix processing described herein. Two of the clusters 410 and 412 can utilize a common ADC array 420 and two of the clusters 414 and 416 can utilize a common ADC array 424. A system controller 430 and I/O buffer 434 can be provided for managing and aggregating results within the respective clusters. In a smaller base cluster configuration where only two clusters are configured, the cluster 410 (e.g., first cluster) can compute a first intermediate result by multiplying vectors from a first portion of the input matrix. The cluster 412 (e.g., second cluster) can compute a second intermediate result by multiplying vectors from a second portion of the input matrix. The analog to digital converter (ADC) array 420 digitizes the first and second intermediate results, respectively from the clusters 410 and 412. An example high-level block diagram of a given cluster is shown at 440. Each cluster can include a plurality of engines formed from a memristor array to compute analog multiplication results between vectors of a sub-matrix, where the sub-matrix is programmed from a portion of the input matrix. Also, each cluster shown at 440 can include shifters to shift a digital value of a first cluster analog multiplication result a predetermined number of bits to generate a shifted cluster result. Also, each cluster shown at 440 can include adders to add the shifted cluster result to a digital value of a second cluster multiplication result to generate a combined multiplication result from the first cluster and the second cluster.

A set of engines (also referred to as DPEs) and associated circuits used to evaluate a sub-matrix can be referred to as a cluster. As noted earlier, a sub-matrix can be sized such that its row and column counts are the same as or less than a given DPE. The number of DPEs in a cluster depends on the capacity of a memristor cell and the size of the matrix elements. If B is the size of fixed point elements in the input matrix, then a cluster needs B/Mb DPEs, where Mb is the number of bits per cell. Thus, the DPEs within a cluster operate on the same submat but on different bit slices with each of them generating partial result in parallel.

These DPEs can be connected together by an active h-tree network in which every joint has a shift and add unit. The h-tree connections are shown in bold at 444. Thus, the final result through the h-tree is the product of submat and the corresponding section of the input vector with the respective bits. Within a cluster, the ADC can be a high overhead component both in terms of silicon real-estate and energy—a single 8 bit ADC takes 7 times the area of a DPE array and consumes over 90% of DPE cluster power. Rather than having an ADC for every DPE column, a single ADC operating at a higher sample rate can be employed per DPE. To further reduce ADC over-head, each DPE shares its ADC with a neighboring cluster as shown at 420 and 424. Since it is unlikely that all DPE clusters within a system will be active simultaneously (due to peak power constraint), sharing allows area savings at a modest performance cost. A DAC array shown at 450 is another component whose area and power values can be similarly considered. A column of DACs that feeds input vector to a DPE as a DAC array. In some aspects, a DAC array can also be shared across clusters to reduce silicon area. Each DPE cluster can operate on a single submat with a common input vector. This input vector is generated using a shared DAC array that fan-outs to all the DPEs within a cluster.

Other than DPE components and h-tree, the cluster 440 also has a local vector buffer 454 and partial result buffer 460 to store input and buffer intermediate outputs. The local vector buffer 454 stores the part of the input vector that operates on the submat mapped to that cluster. For each iteration (or DPE operation), it provides DACb×DPErows bits of data to the DAC array 450, The partial result buffer 460 is used to store and aggregate partial results due to DAC bit slices. It operates at the same rate as ADC sample rate so that the entire cluster can operate in lock step. Each cluster is highly customizable and can cater to a wide range of applications with different matrix dimensions and accuracy requirements.

The DPE specifications such as DAC bits (DACb), cell levels (Mb), ADC output, and shift size can be dynamically configured via registers 464. As an example, if the input matrix has a skewed aspect ratio with very few columns or rows, then some columns in DPEs will not get utilized. The circuit 400 can reduce Mb in such instances to reduce ADC overhead and improve speed. Similarly, if some DPEs are not operational, then they can be disconnected by adjusting the shift-add size at h-tree joints. In a problem that uses every DPE within a cluster, the maximum total number of shift and add operations per full cluster computation is given by the following equation, where Ndpe is the number of DPEs within a cluster, Vectorb is the bitwidth of input vector elements, and SubMatc is the number of columns in the submat Njoints=Vectorb/DACb*(Nd pe−1))*SubMatc.

The circuit 400 shows one example multiplier/accelerator organization. The circuit 400 has multiple clusters 410-416 to operate on various sub-matrices in parallel. Since the output from each cluster is a complete fixed point value, the clusters are connected using a relatively simple h-tree network. Each joint in the h-tree 444 performs a simple add operation instead of shift-and-add performed within a cluster as shown at 440. The system controller 430 keeps track of various sub-matrices mapped to clusters and collects the aggregated result. The central controller 430 is also leveraged to track and avoid DPEs with permanent cell errors. To minimize cluster latency, the entire multiply operation is pipelined, and the number of clusters that can operate in parallel to cap the total power.

After mapping the input matrix to DPE cells, the computation pipeline begins by sending input vector to NAC clusters using an input h-tree, for example. Each cluster receives the portion of the input vector that operates of its submat, and stores it in the local vector buffer 454. In parallel, a bit slice of input vector is sent to the DAC array 450 to initiate DPE computation. After the DPE generates a result, each ADC output is placed on the first level in the active h-tree. The shift-add unit in each h-tree joint serves as pipeline stage for the values traversing the h-tree. Thus, the entire DPE cluster operates in lockstep with ADC sample rate. As clusters generate output, they are sent through the inter cluster h-tree, and the process is repeated for the next clusters until the problem completes. The circuit 400 can communicate to a general purpose processor using traditional DDR bus controller, for example (not shown). In an alternate aspect, clusters can be connected through other network topologies such as a grid, for example. The add operation can be performed on outputs of clusters and can be centralized or distributed depending on the topology and area constraint.

Figure 5:
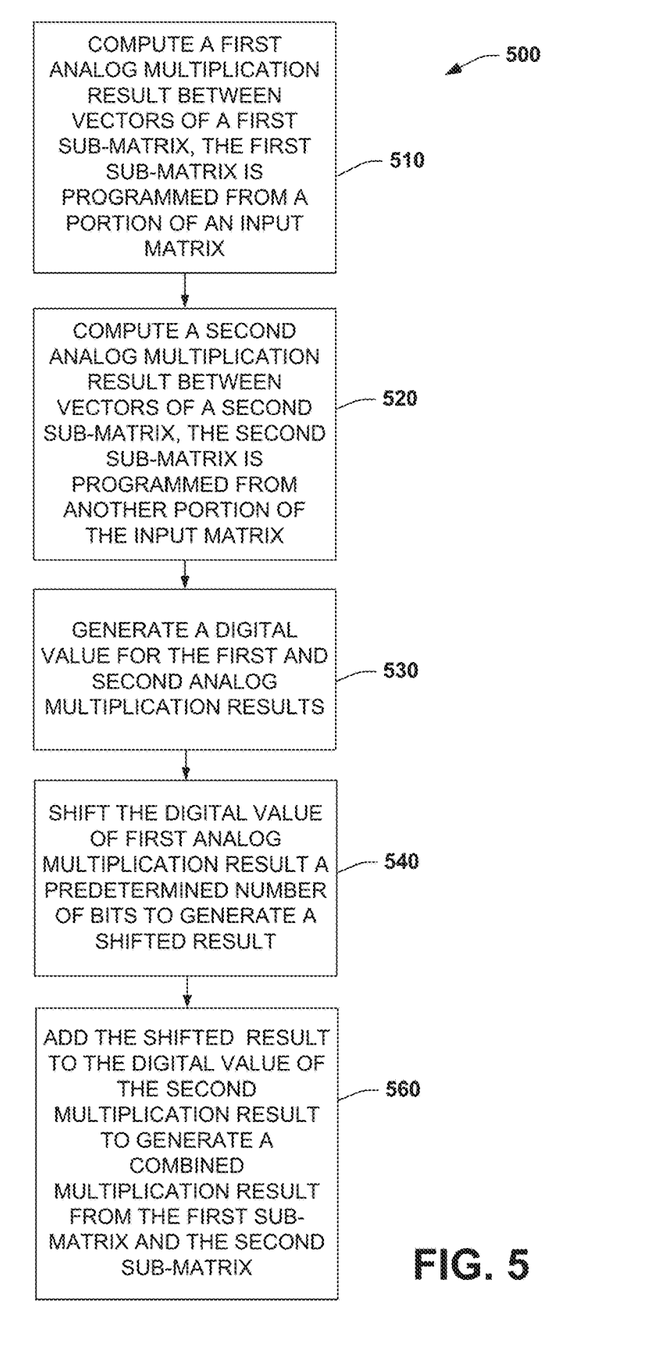
FIG. 5 illustrates an example of a method for performing analog sub-matrix computations from input matrix values.

In view of the foregoing structural and functional features described above, an example method will be better appreciated with reference to FIG. 5. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components and executed by an integrated circuit, computer, or a controller, for example.

FIG. 5 illustrates an example of a method 500 for performing analog sub-matrix computations from input matrix values. At 510, the method 500 includes computing a first analog multiplication result between vectors of a first sub-matrix (e.g., via Engine 110 of FIG. 1). The first sub-matrix is programmed from a portion of an input matrix. At 520, the method 500 includes computing a second analog multiplication result between vectors of a second sub-matrix (e.g., via Engine 120 of FIG. 1). The second sub-matrix is programmed from another portion of the input matrix. At 530, the method 500 includes generating a digital value for the first and second analog multiplication results (e.g., via ADC 130 of FIG. 1). At 540, the method 500 includes shifting the digital value of first analog multiplication result a predetermined number of bits to generate a shifted result (e.g., via shifter 160 of FIG. 1). At 550, the method 500 includes adding the shifted result to the digital value of the second multiplication result to generate a combined multiplication result from the first sub-matrix and the second sub-matrix (e.g., via adder 170 of FIG. 1). As noted previously, multiple sub-matrixes can be concurrently processed via the method 500 such as via the clustering methods described herein. Although not shown the method 500 can also include performing a matrix dot product operation between the vectors, performing a matrix cross product operation between the vectors, or performing a multiply operation between two scalar values. While the method 500 includes computing operations within a cluster, multiple clusters can be operated in parallel such as via the h-tree configuration depicted in FIG. 4 where multiple cluster communicate across the h-tree. A system controller can be provided to then aggregate the results from each respective leg of the h-tree operated by a respective cluster.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A circuit, comprising:
    an engine formed from a memristor array to compute analog multiplication results between vectors of a sub-matrix, the sub-matrix is programmed from a portion of an input matrix;
    an analog to digital converter (ADC) to generate a digital value for the analog multiplication results computed by the engine;
    a shifter to shift the digital value of analog multiplication result a predetermined number of bits to generate a shifted result; and
    an adder to add the shifted result to the digital value of a second multiplication result to generate a combined multiplication result.

2. The circuit of claim 1, wherein the engine configured to perform a matrix dot product operation between the vectors, a matrix cross product operation between the vectors, or a multiply operation between two scalar values.

3. The circuit of claim 1, further comprising a digital to analog converter (DAC) to generate analog representations of the vectors of the sub-matrix.

4. The circuit of claim 3, further comprising a vector buffer o store the vectors to be digitized by the DAC.

5. The circuit of claim 3, further comprising another engine that is configured as a cluster of engines with the engine, with the output of each engine in the cluster combined to form the combined multiplication result.

6. The circuit of claim 5, further comprising a configuration register and a truncation register, the configuration register to dynamically specify a number of DAC bits utilized by the DAC, a number of cell levels in a respective matrix, a number of bits in the ADC output, and a number for shifting the number of bits to generate the shifted result, the truncation register to truncate output from the adder to a predetermined bit width.

7. The circuit of claim 5, wherein the engines communicate across an active h-tree within the cluster of engines and the shift width varies at each level of the h-tree.

8. The circuit of claim 7, further comprising at least one other cluster of engines operating in parallel to the cluster of engines to process another portion of the input matrix, wherein output from each cluster of engines is added to form an overall multiplication result for the input matrix.

9. The circuit of claim 8, further comprising an analog to digital converter (ADC) array that is shared between at least two clusters to generate digital values for analog computation results from the respective clusters.

10. The circuit of claim 9, further comprising a system controller to control the ADC array and to aggregate the computation results from the respective clusters.

11. A circuit, comprising:
    a first cluster to compute a first intermediate result by multiplying vectors from a first portion of an input matrix;
    a second cluster to compute a second intermediate result by multiplying vectors from a second portion of the input matrix;
    an analog to digital converter (ADC) to digitize the first and second intermediate results, respectively; and
    a controller to combine the digitized results of the first and second intermediate results, respectively, wherein each of the first and second clusters include:
        a plurality of engines formed from a memristor array to compute analog multiplication results between vectors of a sub-matrix, the sub-matrix is programmed from a portion of the input matrix;
        a shifter to shift a digital value of a first cluster analog multiplication result a predetermined number of bits to generate a shifted cluster result; and an adder to add the shifted cluster result to a digital value of a second cluster multiplication result to generate a combined multiplication result from the first cluster and the second cluster.

12. The circuit of claim 11, further comprising a digital to analog converter (DAC) to generate analog representations of the vectors of the first and second cluster, respectively.

13. The circuit of claim 12, further comprising a configuration register to dynamically specify a number of DAC bits utilized by the DAC, a number of cell levels in a respective matrix, a number of bits in the ADC output of the ADC array, and a number for shifting the number of bits to generate the shifted cluster result.

14. A method, comprising:
- computing a first analog multiplication result between vectors of a first sub-matrix, the first sub-matrix is programmed from a portion of an input matrix;
- computing a second analog multiplication result between vectors of a second sub-matrix, the second sub-matrix is programmed from another portion of the input matrix;
- generating a digital value for the first and second analog multiplication results, respectively;
- shifting the digital value of first analog multiplication result a predetermined number of bits to generate a shifted result; and
- adding the shifted result to the digital value of the second multiplication result to generate a combined multiplication result from the first sub-matrix and the second sub-matrix.

15. The method of claim 14, performing a matrix dot product operation between the vectors, performing a matrix cross product operation between the vectors, or performing a multiply operation between two scalar values.

\* \* \* \* \*